US008861256B2

United States Patent
Ordentlich et al.

(10) Patent No.: US 8,861,256 B2
(45) Date of Patent: Oct. 14, 2014

(54) DATA STORAGE IN MEMORY ARRAY WITH LESS THAN HALF OF CELLS IN ANY ROW AND COLUMN IN LOW-RESISTANCE STATES

(71) Applicant: Hewlett-Packard Development Company, L.P., Fort Collins, CO (US)

(72) Inventors: Erik Ordentlich, Palo Alto, CA (US); Ron M Roth, Palo Alto, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 236 days.

(21) Appl. No.: 13/630,897

(22) Filed: Sep. 28, 2012

(65) Prior Publication Data

US 2014/0092667 A1    Apr. 3, 2014

(51) Int. Cl.
*G11C 11/00* (2006.01)

(52) U.S. Cl.
USPC ............... 365/148; 365/185.03; 365/230.06

(58) Field of Classification Search
CPC .............. G11C 13/0069; G11C 2213/77; G11C 11/1675
USPC ............... 365/148, 185.03, 230.06
See application file for complete search history.

(56) References Cited

U.S. PATENT DOCUMENTS

| 7,027,342 B2 * | 4/2006 | Inoue .................... 365/210.12 |
|---|---|---|
| 7,057,922 B2 * | 6/2006 | Fukumoto .................... 365/158 |
| 7,239,540 B2 * | 7/2007 | Inoue .......................... 365/158 |
| 7,778,061 B2 | 8/2010 | Robinett et al. |
| 8,045,363 B2 | 10/2011 | Kim |
| 8,098,513 B2 | 1/2012 | Liu et al. |
| 8,139,397 B2 | 3/2012 | Chen et al. |
| 2005/0122768 A1 * | 6/2005 | Fukumoto .................... 365/158 |
| 2005/0276138 A1 * | 12/2005 | Inoue .......................... 365/210 |
| 2007/0159870 A1 * | 7/2007 | Tanizaki et al. ............... 365/148 |
| 2014/0016404 A1 * | 1/2014 | Kim et al. .................... 365/158 |

OTHER PUBLICATIONS

Park, J. et al., "Investigation of State Stability of Low-resistance State in Resistive Memory"; May 2010; http://ieeexplore.ieee.org/stamp/stamp.jsp?arnumber=5433005; pp. 485-487: vol. 31: Issue: 5.

* cited by examiner

*Primary Examiner* — Tuan T Nguyen

(57) ABSTRACT

A method of storing data in a memory array with less than half of memory elements in any row and column in a low-resistance state. The data are arranged in a first portion of an encoding array. High-resistance values are entered in a second portion. A codeword is selected from a covering code for each row in which too many entries have low-resistance values. The selected codeword is used to reduce the number of low-resistance values in that row. A codeword is selected for each column in which too many entries have low-resistance values and the codeword is used to reduce the number of such values in that column. The process is repeated until no row and no column has too many low-resistance values. The array entries are stored in corresponding memory elements.

15 Claims, 7 Drawing Sheets

DATA STORAGE IN MEMORY ARRAY WITH LESS THAN HALF OF CELLS IN ANY ROW AND COLUMN IN LOW-RESISTANCE STATES

BACKGROUND

Resistive switching devices such as memristors and chalcogenide phase change memory cells can be set to any of two or more different resistive states. Devices having two possible states can be set to either a low-resistance state, which typically corresponds with a binary "1", "HI" or "on", or a high-resistance state typically corresponding with a binary "0", "LO" or "off". Devices having more than two possible states are also coming into use. Resistive switching devices can serve as non-volatile memory cells that can be fabricated in nanoscale two-dimensional crossbar structures or other two-dimensional arrays in which each cell is connected between a row conductor and a column conductor with very high cell density. In such an array, a given storage cell may be accessed by selecting appropriate row and column conductors, for example by applying a voltage across the row conductor and the column conductor between which that given cell is connected.

BRIEF DESCRIPTION OF THE DRAWINGS

The figures are not drawn to scale. They illustrate the disclosure by examples.

DETAILED DESCRIPTION

Figure 1:
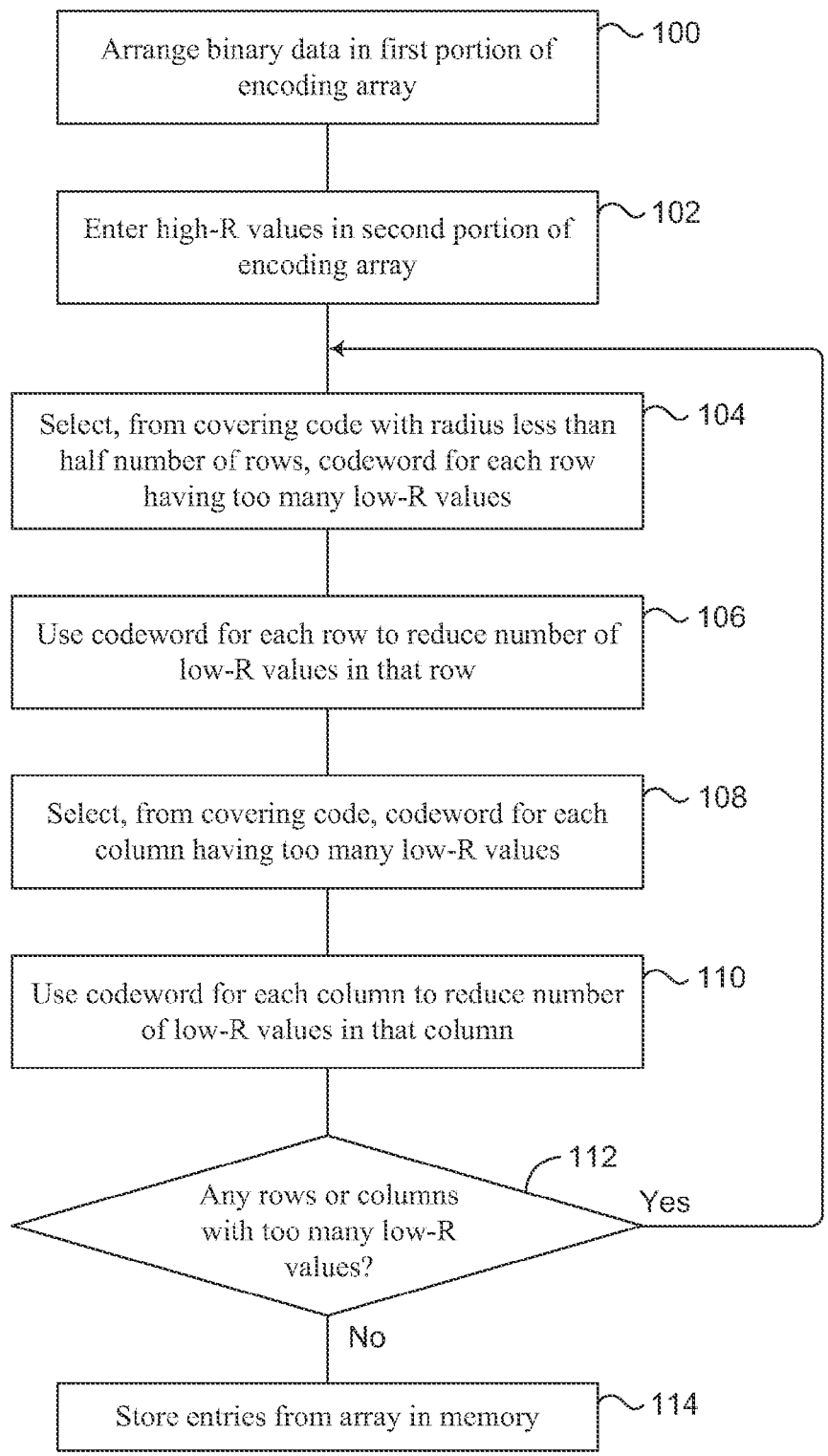
FIG. 1 is a flow chart giving an example of a method of storing binary data in a memory array with less than half of memory elements in any row and column of the array in a low-resistance state.

Illustrative examples and details are used in the drawings and in this description, but other configurations may exist and may suggest themselves. Parameters such as voltages, temperatures, dimensions, and component values are approximate. Terms of orientation such as up, down, top, and bottom are used only for convenience to indicate spatial relationships of components with respect to each other, and except as otherwise indicated, orientation with respect to external axes is not critical. For clarity, some known methods and structures have not been described in detail. Methods defined by the claims may comprise steps in addition to those listed, and except as indicated in the claims themselves the steps may be performed in another order than that given.

The systems and methods described herein may be implemented in various forms of hardware, software, firmware, special purpose processors, or a combination thereof. At least a portion thereof may be implemented as an application comprising program instructions that are tangibly embodied on one or more program storage devices such as hard disks, magnetic floppy disks, RAM, ROM, and CDROM, and executable by any device or machine comprising suitable architecture. Some or all of the instructions may be remotely stored; in one example, execution of remotely-accessed instructions may be referred to as cloud computing. Some of the constituent system components and process steps may be implemented in software, and therefore the connections between system modules or the logic flow of method steps may differ depending on the manner in which they are programmed.

One of the challenges in developing high-density memories based on crossbars of resistive switching devices is the "half select" problem. To write to or read from such a device, a write or read potential is applied to that device through its column and row conductors. Although only the device connected to both the row and the column conductors receives the full potential, some of it also appears across other devices connected to the same row or column conductors. These other devices are said to be "half selected" because one of their two terminals is connected to an active row or column. If a half-selected device is in its low-resistance state it will draw some amount of current. As there can be many devices connected to each row and each column conductor in a large crossbar array, the cumulative effect of this current draw can be significant, resulting in wasted power, negatively impacting read sensitivity in terms of the on/off current ratio used to determine the state of the selected device, and reducing longevity of the array through such mechanisms as excess heat dissipation and unnecessary stressing of the half-selected devices. Techniques have been developed to prevent more than half of the devices in any row or column from being placed in their low-resistance states at any given time, but this has not adequately solved the problem and there remains a need for a way to mitigate the adverse effects of current flow through haft-selected devices in memory arrays.

FIG. 1 shows an example of a method of storing binary data in a memory array with less than half of memory elements in any row and column of the array in a low-resistance state. The method includes arranging the binary data in a first portion of an encoding array having as many rows and columns as the memory array (100). High-resistance ("high-R") values are entered in a second portion of the encoding array (102). A codeword is selected from a covering code with a covering radius equal to a predetermined number that is less than half the number of rows in the encoding array for each row of the encoding array in which more entries than the predetermined number have low-resistance values (104). The number of low-resistance values in each such row is reduced by using the codeword for that row (106). A codeword is selected from the covering code for each column of the encoding array in which more entries than the predetermined number have low-resistance values (108). The number of low-resistance values in each such column is reduced by using the codeword for that column (110). If any rows or columns still contain too many low-resistance values, the steps of selecting a codeword for each such row, using the codeword to reduce the number of low-resistance values in the row, selecting a codeword for each such column, and using the codeword to reduce the number of low-resistance values in the column, are repeated until no row and no column has more than the predetermined number of low-resistance values (112). The entries from the encoding array are stored in corresponding memory elements of the memory array (114).

In some examples a binary zero is indicated by a high-resistance state of a memory element and a binary one is indicated by a low-resistance state. In this case, to enter a high-resistance value in a position in the encoding array means to enter a binary zero in that position. Then, storing entries from the encoding array in the memory array means that for each position in the encoding array that contains a binary zero, the corresponding element of the memory is set to a high-resistance state, and for each encoding array position that contains a one, the corresponding element of the memory array is set to a low-resistance state.

If the memory array is square (number of rows equals number of columns) the encoding array will also be square. In some examples the bottom rows and right-hand columns of the encoding array comprise the second portion, and the remainder of the encoding array comprises the first portion.

In some examples the covering code is determined ahead of time and stored in computer memory or in some form of data storage and retrieved whenever it is desired to write data into the memory array. In other examples the covering code is calculated anew each time data are to be stored in the memory array.

Figure 2A:
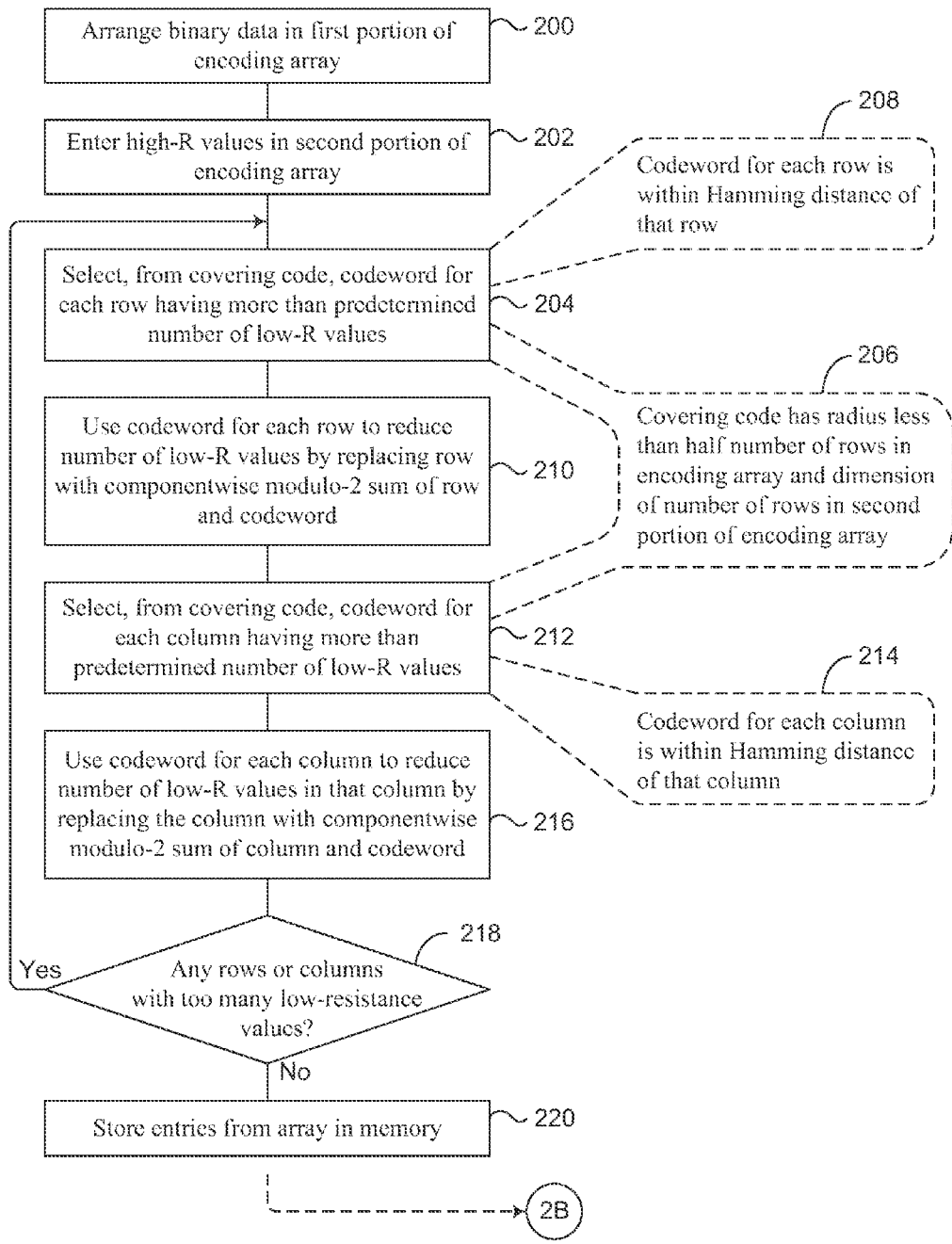
FIGS. 2A and 2B provide a flow chart giving another example of a method of storing binary data in a memory array with less than half of memory elements in any row and column of the array in a low-resistance state and retrieving the data from the memory array.

FIG. 2A shows another example of a method of storing binary data in a memory array with less than half of memory elements in any row and column of the array in a low-resistance state. The method begins with arranging the binary data in a first portion of an encoding array (200). The encoding array has as many rows and columns as the memory array. High-resistance values, which as noted above may be binary zeros, are entered in a second portion of the encoding array (202). A codeword is selected from a covering code for each row having more than a predetermined number of low-resistance values (204).

The covering code has a covering radius equal to a predetermined number that is less than half the number of rows in the encoding array, and the covering code has a dimension equal to the number of rows in the second portion of the encoding array (206). This predetermined number equals the maximum number of entries in any row and any column that can have low-resistance values. As in the example already discussed, the covering code may be determined in advance and used every time data are to be written to the memory, or the covering code may be calculated each time data are presented for storing in the memory.

In some examples the row and the codeword selected for that row are within a Hamming distance of each other (208), the Hamming distance being equal to the covering radius of the covering code, as will be discussed in more detail presently. The codeword selected for a row is used to reduce the number of low-resistance values in that row by replacing the row with a componentwise modulo-2 sum of the row and the codeword (210).

Similarly, a codeword is selected from the foregoing covering code for each column having more than the predetermined number of low-resistance values (212). In some examples the column and the codeword for that column are within Hamming distance of each other (214), the Hamming distance being equal to the covering radius of the covering code. The codeword for each column is used to reduce the number of low-resistance values in that column by replacing the column with a componentwise modulo-2 sum of the column and the codeword (216).

If any rows or columns still contain too many low-resistance values, the steps of selecting a codeword for each such row, using the codeword to reduce the number of low-resistance values in the row, selecting a codeword for each such column, and using the codeword to reduce the number of low-resistance values in the column, are repeated until no row and no column has more than the predetermined number of low-resistance values (218). Then the entries from the encoding array are stored in corresponding memory elements of the memory array (220).

Figure 2B:
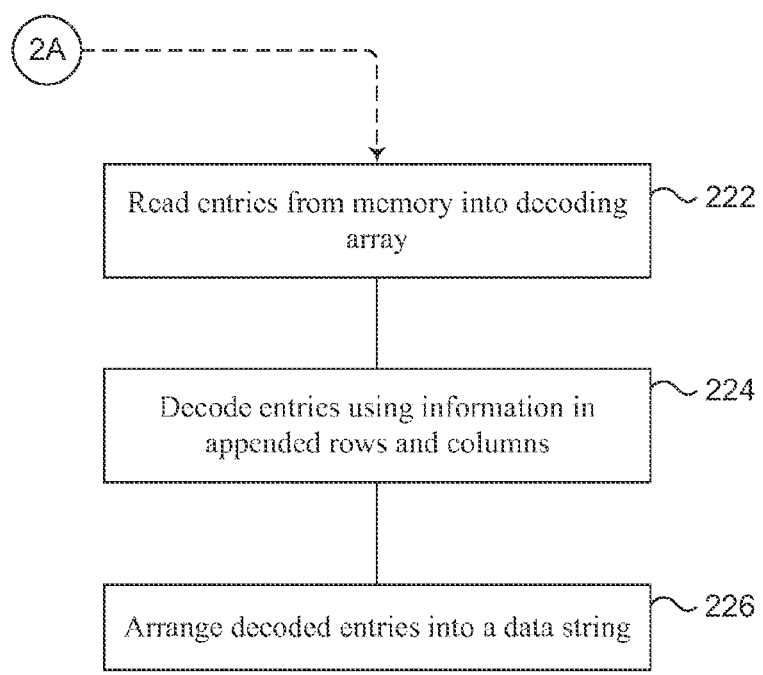

FIG. 2B continues the example of FIG. 2A, showing an example of retrieving the data from the memory array. Entries are read from the memory elements into a decoding array (222), the entries are decoded using information in the appended rows and columns (224), and the decoded entries are arranged into a data string (226).

The selection of covering codes and codewords will now be described in more detail. It will be assumed that the encoding array is square, but the principles disclosed herein may be extended to encoding arrays that are not square. In the following description, given two subsets $S_1$ and $S_2$ of a set $S=\{1, 2, \ldots, n\}$, $A_{S_1,S_2}$ will denote those entries in matrix A having indices (i,j) that meet the requirements $i \in S_1$ and $j \in S_2$. For a positive integer l:

$$[l]=\{1,2,\ldots,l\}$$

and for two positive integers $l_1$ and $l_2$, if $l_1 < l_2$:

$$[l_1:l_2]=\{l_1, l_1+1, l_1+2, \ldots, l_2\}$$

A covering code $\mathcal{C}$ comprises a set of binary sequences:

$$\mathcal{C} \subset \{0,1\}^t$$

and this covering code has a radius R that is defined as:

$$R=R(\mathcal{C})=\max_{x \in \{0,1\}^t} \min_{y \in \mathcal{C}} d_H(x,y)$$

where $d_H(x,y)$ means the Hamming distance between the binary sequences x and y. The Hamming distance is the number of positions in which the two sequences differ. Given any binary sequence of length t there exists at least one codeword in the covering code $\mathcal{C}$ differing from that sequence in no more than R positions. In some examples a covering code that contains fewer rather than more codewords for a given radius is selected.

In the foregoing examples, where the number of low-resistance values in rows and columns of an encoding array is reduced iteratively, a linear covering code is used (a linear code is one for which the componentwise modulo-2 sum of any pair of codewords is also a codeword). The radius R of the covering code will be equal to the maximum number of low-resistance values that can appear in any row and column, or in other words R=r where r is the predetermined maximum number of low-resistance values. The dimension of the covering code will be k, the number of rows (and k is also the columns since the array is square) that are initially set to contain high-resistance values (binary zeros in some examples).

Let G be a k×n generator matrix of $\mathcal{C}$ of the form [G'|I] where I is the k×k identity matrix. $\mathcal{C}$ then consists of the $2^k$ words $$\mathcal{C}=\{z^T[G'|I]:z \in \{0,1\}^k\}$$

where the matrix multiplication is modulo 2. The information bits of $\mathcal{C}$ are the last k bits in $\mathcal{C}$.

The overall array has a redundancy of $n^2-(n-k)^2=2nk-k^2$. This redundancy is the number of positions that were filled with high-resistance values. The bits in these positions can be used to undo the encoding process and recover the original binary data when the contents of the memory are read into a decoding array.

The codewords for the various rows and columns that need them can be found in various ways. Some covering codes, when viewed as error correcting codes, have efficient maximum likelihood decoding algorithms for the binary symmetric channel. In these cases, the error correcting decoding algorithm can be applied to the row or column in question to obtain a codeword within the covering radius.

Another covering code that is used in some examples is a first-order Reed-Muller code with n=$2^p$, k=1+$\log_2$ n and R≤n/2−$\sqrt{n}$/2, for some positive integer p (i.e., n is a power of 2). This code has an efficient maximum-likelihood decoding procedure that facilitates its use in finding codewords.

The iterative process in the examples of FIGS. 1 and 2A is guaranteed to terminate because each row and column replacement decreases the number of low-resistance values in the encoding array by at least one.

Decoding starts with recognizing that the codeword y for a given row is aligned so that the component of y that was added to a given entry $A_{i,j}$ is $y_{[n-k+1:n]}G_{[k],j}$ where $G_{[k],j}$ is the $j^{th}$ column of G and $y_{[n-k+1:n]}$ is the row vector $[y_{[n-k+1]}, y_{[n-k+2]}, \ldots, y_n]$. In particular, by the above structure of G, $y_{[n-k+1:n]}$ is added to the last k columns. Similarly, the codeword y for a given column is aligned so that the component of y that was added to a given entry $A_{i,j}$ is $y_{[n-k+1:n]}G_{[k],i}$. In particular, $y_{[n-k+1:n]}$ is added to the last k rows. Given an array A that was produced by the method shown in FIG. 2A, the data bit $U_{i,j}$ that was placed into position (i,j) when the data bits were first arranged in the encoding array can be recovered from the encoded data as written in the memory array and read from there into a decoding array A by:

$$U_{i,j}=A_{i,j}+G_{[k],i}{}^T A_{[n-k+1:n],j}+A_{i,[n-k+1:n]}G_{[k],j}+G_{[k],i}{}^T A_{[n-k+1:n],[n-k+1:n]}G_{[k],j}.$$

Since the data are binary, the operations are modulo 2.

Figure 3A:
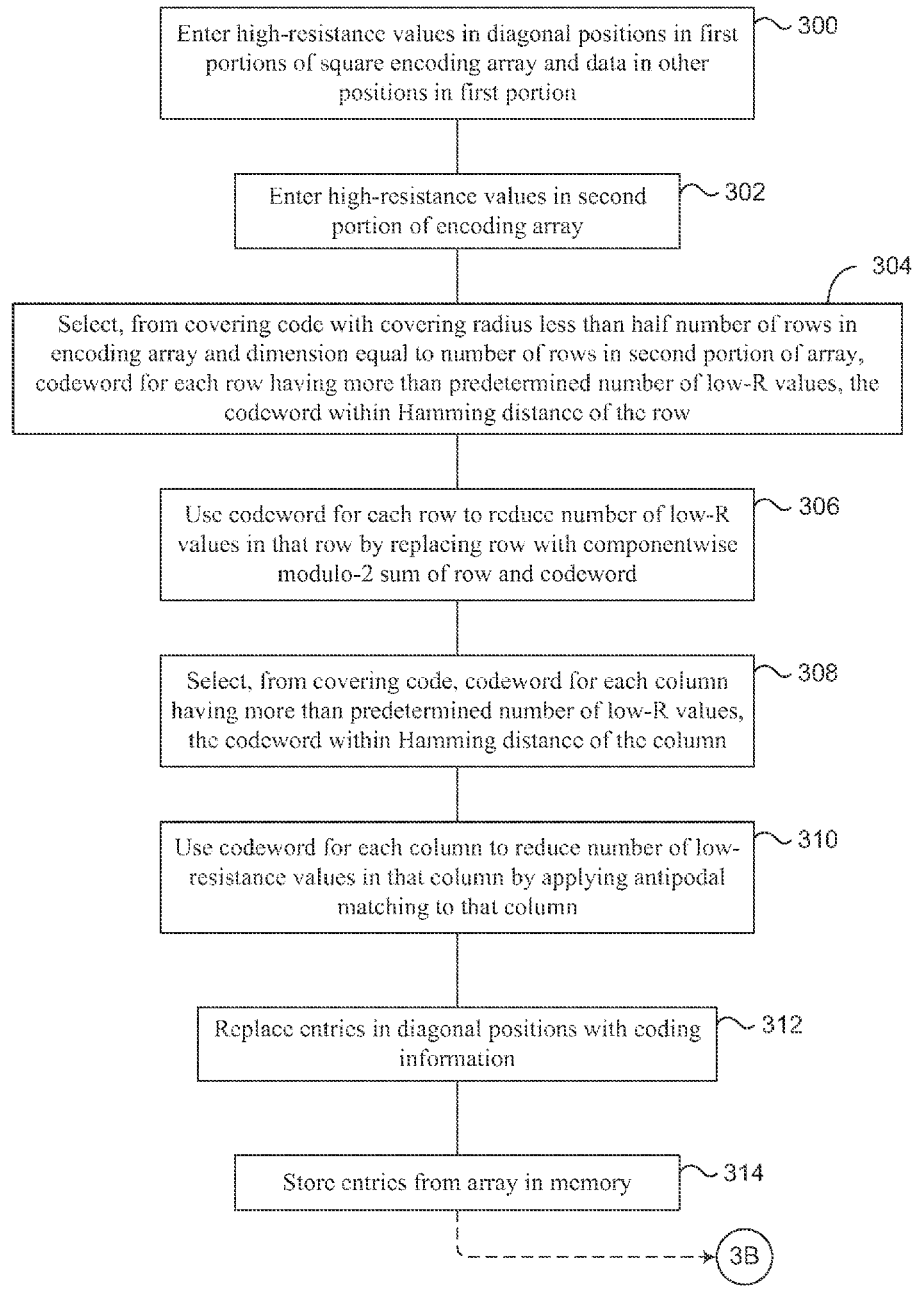
FIGS. 3A and 3B provide a flow chart giving another example of a method of storing binary data in a memory array with less than half of memory elements in any row and column of the array in a low-resistance state and retrieving the data from the memory array.

The iteration in the examples of FIGS. 1 and 2A can be avoided by using antipodal matchings. This is illustrated in FIG. 3A, which shows another example of a method of storing binary data in a memory array with less than half of memory elements in any row and column of the array in a low-resistance state. The method begins with entering high-resistance values in diagonal positions of a first portion of a square encoding array and the binary data in other positions (300). High-resistance values are also entered in a second portion of the encoding array (302). The extended encoding array has as many rows and columns as the memory array.

As in the previous examples, a covering code may have been pre-selected or may be computed each time data are to be encoded for storing in the memory. The covering code has a covering radius less than half the number of rows in the encoding array and a dimension equal to the number of rows in the second portion of the encoding array. This covering radius may be equal to a predetermined number that represents the maximum number of entries in any row that may have low-resistance values. A codeword is selected from the covering code for each row of the encoding array in which more than the predetermined number of entries are low-resistance values. In some examples the row and the codeword selected for that row differ from each other by a Hamming distance equal to the covering radius (304).

The codeword for each row is used to reduce the number of low-resistance values in that row by replacing the entries of the row, except any diagonal entry, with a componentwise modulo-2 sum of the row and the codeword (306).

A codeword is selected from the covering code for each column in which more than the predetermined number of entries have low-resistance values (308). The codeword for each column is used to reduce the number of low-resistance values by applying antipodal matching to that column (310). Some or all of the diagonal entries of the encoding array are replaced with coding information (312) and then the entries of the encoding array are written to corresponding locations in the memory array (314).

Figure 3B:
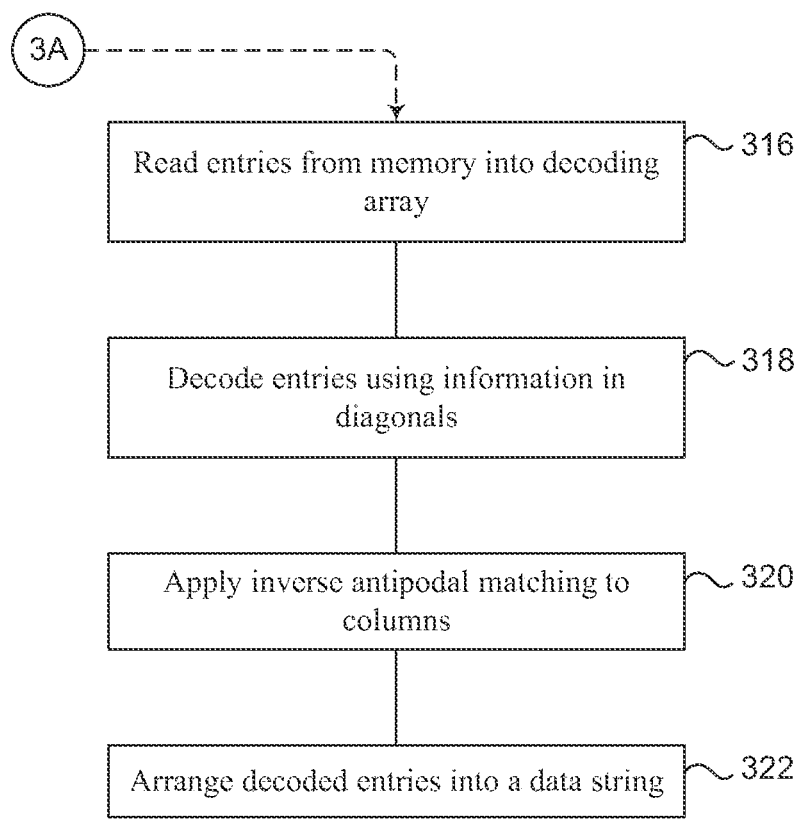

FIG. 3B continues the example of FIG. 3A with an example of retrieving the data from the memory array. Entries are read from the memory elements into a decoding array (316). The entries in the decoding array are decoded using information in the diagonals (318) and an inverse antipodal matching (320). The decoded entries are arranged into a data string (322).

An antipodal matching is a one-to-one mapping between length t binary sequences of Hamming weight greater than t/2 and those of Hamming weight less than t/2 with the properties that (i) the sum of the Hamming weights of the input and output sequences is t and (ii) the output sequence is componentwise smaller than or equal to the input sequence. Thus, in examples where a binary zero represents a high-resistance value, no component that is a zero in the data sequence that is presented for encoding can become a one in the encoded sequence that is written to the memory array.

The antipodal matching weight limiting code for arrays applies antipodal matchings to rows having more than the predetermined number of low-resistance values, thereby avoiding creation of any columns having too many such values. Likewise, applying antipodal matchings to columns having more than the predetermined number of low-resistance values avoids creating any rows having too many such values, and there is no need to iterate. Reserved positions in the array are used to encode the rows and columns to which antipodal matchings are applied, thus allowing the process to be reversed for decoding the entries that are written to the memory array.

The use of antipodal matchings may be implemented by applying an antipodal matching to the sub-sequence of positions in each column in which the number of low-resistance values exceeds the predetermined number corresponding to the positions indexed by [1:n−k] in which the codeword that reduces the Hamming distance is 1. These bits would have been flipped (changed from ones to zeros and vice versa) if the codeword had simply been added to the column. The bits indexed by [n−k+1:n] of the codeword are copied into the reserved boundary positions of the array in the affected column to allow for recovery by the decoder of the positions to which the antipodal matching was applied. By the behavior of Hamming weight under antipodal matching (this behavior is identical to the behavior under bit flipping), the weight of the resulting column is the same as if the codeword were added in, and is thus constraint satisfying. On the other hand, no new constraint violations are created in the first n−k rows because of property (ii) above (monotonicity) of the antipodal matching.

Antipodal matchings can be computed in various ways. One way is described in co-pending U.S. patent application PCT/US2011/027127 filed 4 Mar. 2011 and assigned to the same assignee as the present application. In the example of FIG. 3A, $k^2$≤n−k. For Reed-Muller code parameters this is reasonable because k is logarithmic in n. The codewords in the example of FIG. 3A belong to an underlying linear covering code of block length n−1, as opposed to n for the example of FIG. 2A, and the predefined number (weight constraint on the encoded array) that represents the maximum number of entries in any encoded row and column that can have low-resistance values is expressed as r+1 rather than r.

In an example of the kind described in FIG. 3A, using the codeword for each column to reduce the number of ones (low-resistance values) in that column by antipodal mapping (310) includes:

for each column having r+1 or more ones, finding a codeword that is within Hamming distance r of that column, not counting the diagonal position;

replacing, in the first n−k positions in that column (excluding any diagonal position for the left most n−k columns and excluding any single predetermined position in the first n−k rows of each of the right most k columns), the sub-sequence of positions corresponding with locations of ones in the codeword by an antipodal matching of suitable length applied to the bits in this sub-sequence of positions; and replacing positions in the last k entries of the column with the corresponding bits in the codeword (these are the information bits).

Next, replacing entries in diagonal positions with coding information (312) includes, for d=1 to k, for each row n−k+d having r+1 or more ones:

finding a codeword in the covering code that is within Hamming distance r of the row (excluding any diagonal entry);

setting entries in k diagonal positions in A starting with $A_{(1+k(d-1),1+k(d-1))}$ equal to the k information bits of the codeword; and replacing the positions in row n−k+d excluding any diagonal, corresponding with the locations of ones in the codeword by the antipodal matching of suitable length applied to this subsequence of bits from the row.

In an example of the type shown in FIG. 3B, decoding the entries using information in the diagonals of the encoded matrix B as read from the memory array (318) includes:

(1) for d=1 to k, if k consecutive diagonal bits starting at positions in the encoded array $B_{(1+k(d-1),1+k(d-1))}$ are not all zeros:

(a) determine the codeword corresponding with k information bits in consecutive diagonal positions starting with position $B_{(1+k(d-1),1+k(d-1))}$;

(b) enter zeros in k diagonal positions staring with position $B_{(1+k(d-1),1+k(d-1))}$; and (c) replace the positions in row n−k+d excluding any diagonal position, corresponding with the locations of ones in the determined codeword by the inverse antipodal matching applied to this subsequence of bits in the row;

(2) for each column of B:

(a) determine the codeword corresponding with information bits in the last k entries of the column; and (b) replace the positions in the first n−k rows of the column, excluding any diagonal position for the left most n−k columns and excluding the single predetermined position excluded during encoding in the first n−k rows of each of the right most k columns, corresponding with the locations of ones in the determined codeword by the inverse antipodal matching of suitable length applied to this subsequence of bits of the column;

(3) for each of the first n−k rows of B determine a codeword corresponding with information bits in the last k columns of the row. Replace the row in positions excluding the diagonal position with the componentwise modulo-2 sum of the row in these positions and the determined codeword;

(4) use the entries in the first row of $B_{[n-k],[n-k]}$ except the diagonal position (1,1) as the first n−k−1 bits of the recovered data stream, then the entries in the second row of $B_{[n-k],[n-k]}$ except the diagonal position (2,2) as the next n−k−1 bits of the recovered data stream, and so on through the last row of $B_{[n-k],[n-k]}$ except the diagonal position (n−k)(n−k) at which time entire data stream will have been recovered.

If $k^2 > n-k$ additional off-diagonal elements of the array would be reserved for conveying the information bits of the codewords used in the antipodal matching. This would also result in an increase in the maximum weight of any row and column of the encoded array, but a shorter covering code block length could be used (shortened by the number of additional off-diagonals needed).

Figure 4A:
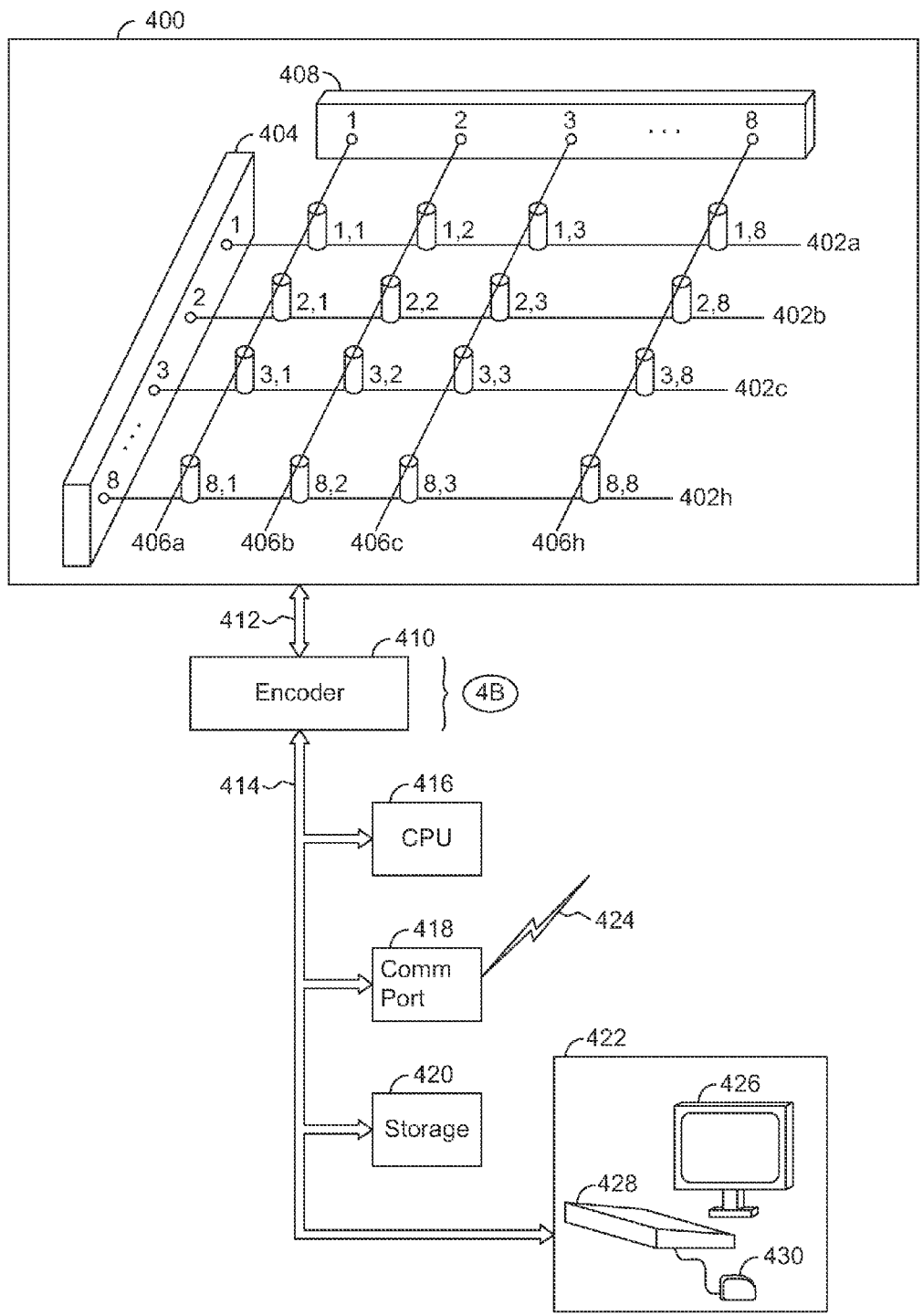
FIG. 4A is a functional block diagram of an example of a memory system with less than one-haft of storage cells in any row and column of a memory array in low resistance states at the same time.
Figure 4B:
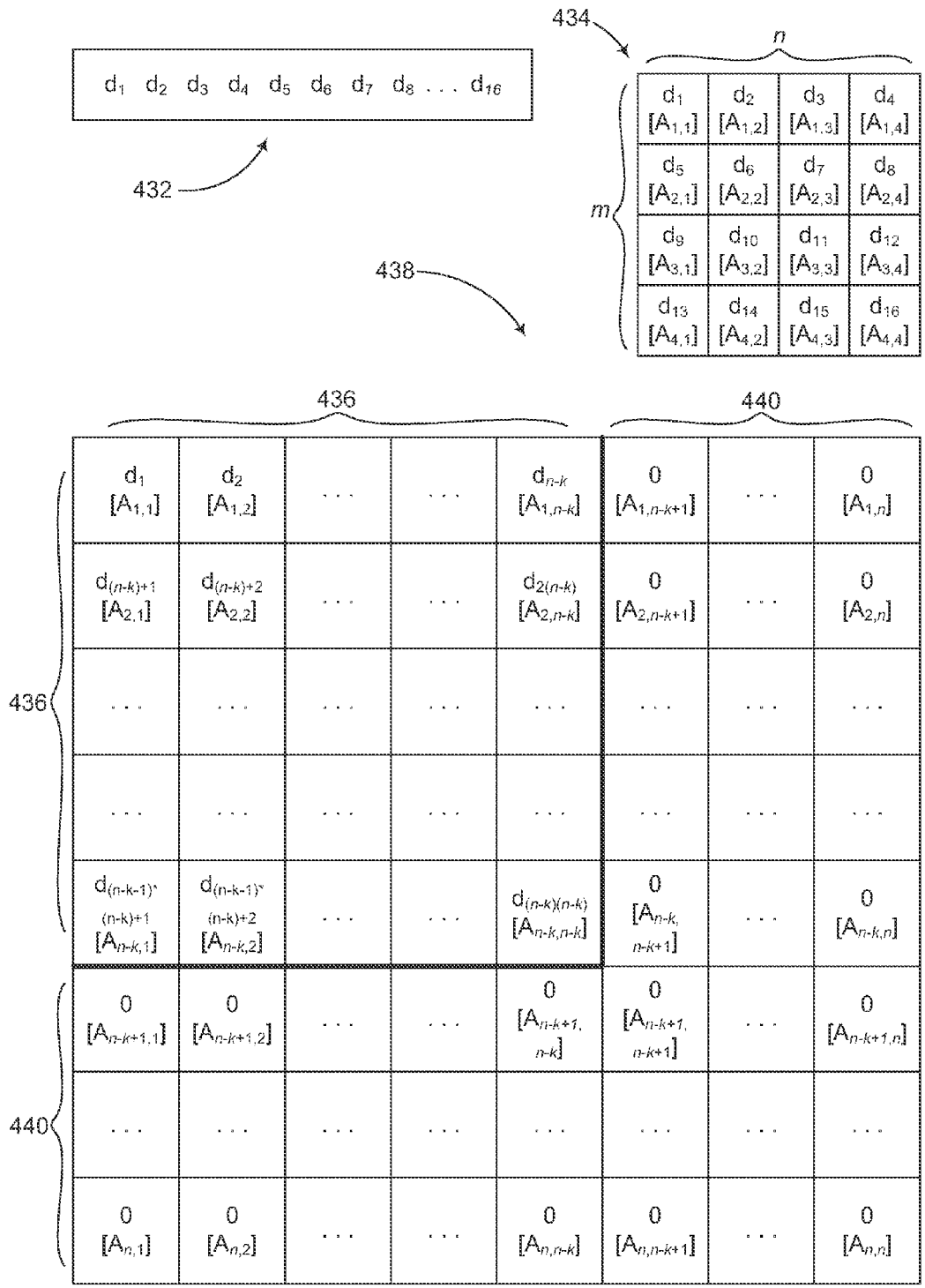
FIG. 4B is a diagram giving examples of encoding arrays that may be used in the system illustrated in FIG. 4A.

FIGS. 4A and 4B provide an example of a memory system with less than one-half of storage cells in any row and column of a memory array in low resistance states at the same time. A memory array 400 includes a plurality of row conductors 402*a* through 402*h* defining rows 1 through 8. The row conductors are connected to a row control circuit 404. A plurality of column conductors 406*a* through 406*h* define columns 1 through 8. The column conductors are connected to a column control circuit 408. A storage cell is located at each row-column crossing. For example, a storage cell 1,1 is connected between the row conductor 402*a* defining row 1 and the column conductor 406*a* defining column 1. The storage cells can be placed into any of two or more resistance states. In one example the cells comprise memristors, in another example they comprise chalcogenide cells, and in other examples they comprise other materials. The control circuits may comprise one or more of read sense amplifiers, write drivers, demultiplexers, latches, and other control elements.

An encoder 410 communicates with the memory array, for example through a bus 412. The encoder in turn communicates through a bus 414 with other system devices which may include one or more of a CPU 416, a communication port 418, a storage unit 420 such as a hard disk, and a user terminal 422. The communication port 418 may communicate with other nearby systems or through longer-distance communication lines with remote systems or remote users, as indicated by a communication link 424. The terminal 422 may include such devices as a visual display 426, a keyboard 428 and a pointer 430.

In some examples the row and column control circuits 404 and 408 and the encoder 410 are implemented in stand-alone devices which may include hardware or software or both. In other examples some or all of the functions of the row and column control circuits 404 and 408 and of the encoder 410 may be performed by the CPU 416 or by other system devices.

The encoder receives data bits for storage in the memory array. The data bits may be provided by the CPU 416 or by other system devices, or they may be communicated from a remote location through the communication port 418. The data may arrive in the form of a string of p binary bits $d_1$ through $d_p$ as represented by a string 432.

In the string 432, p=16. These 16 bits may be entered into an array such as an example array 434 by sequentially filling positions in the first row, then the second, and so on. The term enclosed in brackets identifies the position. More particularly, the term $A_{i,j}$ indicates the entry in the $i^{th}$ row and $j^{th}$ column of the array. For example, bit $d_2$, which may have a binary value of either zero or one, has been placed in position $[A_{1,2}]$, that is, in row 1, column 2. The first four bits $d_1$ through $d_4$ have been entered into the first row in positions $A_{1,1}$ through $A_{1,4}$ respectively. The next four bits $d_5$ through $d_8$ are entered into the second row in positions $A_{2,1}$ through $A_{2,4}$ respectively, and so on.

The total number of rows in an array may be represented by m and the total number of columns is represented by n. In the example array 434, there are four rows and four columns, so m=4 and n=4.

An encoding array will have the same number of rows and columns as the memory array in which the data from the encoding array are to be stored. In the example of FIG. 4A, the memory array 400 is a square array, so m=n and therefore n may be used to indicate the number of rows as well as the number of columns.

In this example the encoder enters the data that is to be written to memory into a first portion 436 of an encoding array 438. The first portion 436 includes the first (n–k) column positions in the first (n–k) rows of the encoding array 438. The encoder enters high-resistance values, which in some examples are binary zeros, into a second portion 440 of the encoding array. The number of rows in the second portion 440 of the array 438 is k. Since there are n rows in all, the number of data rows will be (n–k). Similarly, the number of columns in the second portion 440 is k and the number of data columns will therefore be (n–k).

As in the previous examples, this example uses a covering code having a covering radius equal to a predetermined number that is less than one-half the number n of rows of the encoder array 438. The encoder selects a codeword from the covering code for each row of the encoder array 438 having more entries than the predetermined number corresponding with low resistance states. For example, in the case of an 8×8 encoding array, if the predetermined number is 3, then not more than 3 entries in any row can be low-resistance entries when the row is written into the memory array. As indicated above, in some examples a binary one is a low-resistance entry, so in such examples not more than 3 entries in any row could be ones. The encoder changes the entries in each row having more than the predetermined number of low-resistance entries according to the codeword selected for that row.

Then the encoder selects a codeword from the covering code for each column of the encoder array 438 having more entries than the predetermined number corresponding with low resistance states. The encoder changes the entries in each such column according to the selected codeword for that column.

If, after the encoder has changed the row and column entries, any row or column has more than the predetermined number of low-resistance values, the process is repeated until no row and no column has more than the predetermined number of low-resistance values. Then the encoder applies signals to the row and column conductors to write entries from the encoder array into the cells.

In other examples the encoder uses antipodal matching and thereby avoids any need to reduce the number of low-resistance values in the rows and then in the columns more than once.

Storing data in a memory array with less than half of cells in any row and column in low-resistance states reduces the adverse effects of current flow through half-selected devices in memory arrays, saving energy and enabling memory systems to operate at higher speeds and with less chance of error and with smaller driving circuitry required to drive adequate current through the row and column conductors.

What is claimed is:

1. A method of storing binary data in a memory array with less than half of memory elements in any row and column of the array in a low-resistance state, the method comprising:
arranging the binary data in a first portion of an encoding array, the encoding array having as many rows and columns as the memory array;
entering high-resistance values in a second portion of the encoding array;
selecting, from a covering code with a radius equal to a predetermined number that is less than half the number of rows in the encoding array, a codeword for each row in which more entries than the predetermined number are low-resistance values;
using the codeword for each such row to reduce the number of low-resistance values in that row;
selecting from the covering code a codeword for each column in which more entries than the predetermined number are low-resistance values;
using the codeword for each such column to reduce the number of low-resistance values in that column;
if any row or column still has too many low-resistance values, repeating the preceding steps of selecting and using codewords until no row and no column has more low-resistance values than the predetermined number; and
storing the entries from the encoding array in corresponding memory elements of the memory array.

2. The method of claim 1 wherein the covering code has a dimension equal to the number of rows in the second portion of the encoding array.

3. The method of claim 1 wherein the codeword for each row and column is within a Hamming distance from that row or column, the Hamming distance being equal to the covering radius.

4. The method of claim 3 wherein reducing the number of low-resistance values in a row comprises replacing the row with a componentwise modulo-2 sum of the row and the codeword for that row.

5. The method of claim 3 wherein reducing the number of low-resistance values in a column comprises replacing the column with a componentwise modulo-2 sum of the column and the codeword for that column.

6. The method of claim 5 and further comprising retrieving the binary data from the memory array by reading entries from the memory elements into a decoding array, decoding the entries using information in the appended rows and columns, and arranging the decoded entries into a data string.

7. The method of claim 4 wherein:
the encoding array is a square array; and
arranging the data in the first portion of the encoding array comprises entering high-resistance values in diagonal positions of that portion and entering the data into other positions.

8. The method of claim 7 wherein reducing the number of low-resistance values in a column comprises applying an antipodal matching to the column.

9. The method of claim 8 and further comprising replacing entries in diagonal positions of the encoding array with coding information.

10. The method of claim 9 and further comprising retrieving the binary data from the memory elements by reading entries from the memory elements into a decoding array, decoding the entries using information in diagonals of the decoding array, and arranging the decoded entries into a data string.

11. The method of claim 10 wherein decoding the entries comprises applying an inverse antipodal matching to rows of the decoding array.

12. A memory system that stores binary data with less than one-half of storage cells in any row and column of a memory array in low resistance states at the same time, the system comprising: a plurality of row and column conductors; a plurality of storage cells capable of being placed into any of two or more resistance states, each cell connected between a different combination of row and column conductors to define a memory array; and a memory controller to:
receive binary data for storage;
arrange the data in a first portion of an encoding array, the encoding array having as many rows and columns as the memory array;

enter high-resistance values in a second portion of the encoding array;

select a codeword, from a covering code having a covering radius equal to a predetermined number that is less than one-half the number of rows of the encoder array, for each row of the encoder array having more entries than the predetermined number corresponding with low resistance states, and change the entries in that row according to the selected codeword;

select a codeword from the covering code for each column of the encoder array having more entries than the predetermined number corresponding with low resistance states, and change the entries in that column according to the selected codeword;

if any row or column still has too many low-resistance values, repeating the preceding steps of selecting codewords and changing entries until no row and no column has more low-resistance values than the predetermined number; and apply signals to the row and column conductors to write entries from the encoder array into the cells.

13. The system of claim 12 wherein the storage cells comprise at least one of memristors and chalcogenide phase change memory cells.

14. The system of claim 12 wherein entries in a row or column are changed by replacing the entire row or column with a componentwise modulo-2 sum of the row or column and the codeword for the row or column and repeating until no more entries than the predetermined number in that row or column correspond with low resistance states.

15. The system of claim 12 wherein entries in a row are changed by replacing the entire row with a componentwise modulo-2 sum of the row and the codeword for the row, and entries in a column are changed by applying an antipodal matching to a subsequence of the column.

* * * * *

UNITED STATES PATENT AND TRADEMARK OFFICE
CERTIFICATE OF CORRECTION

| | | |
|---|---|---|
| PATENT NO. | : 8,861,256 B2 | Page 1 of 1 |
| APPLICATION NO. | : 13/630897 | |
| DATED | : October 14, 2014 | |
| INVENTOR(S) | : Erik Ordentlich et al. | |

It is certified that error appears in the above-identified patent and that said Letters Patent is hereby corrected as shown below:

In the Claims

In column 10, line 9, in Claim 1, delete "repealing" and insert -- repeating --, therefor.

Signed and Sealed this
Fourteenth Day of April, 2015

Michelle K. Lee
*Director of the United States Patent and Trademark Office*